(12) United States Patent
Li et al.

(10) Patent No.: US 6,261,851 B1
(45) Date of Patent: Jul. 17, 2001

(54) OPTIMIZATION OF CMP PROCESS BY DETECTING OF OXIDE/NITRIDE INTERFACE USING IR SYSTEM

(75) Inventors: Leping Li, Poughkeepsie, NY (US); James A. Gilhooly, St. Albans; Clifford O. Morgan, III, Burlington, both of VT (US); Cong Wei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/410,265

(22) Filed: Sep. 30, 1999

(51) Int. Cl.[7] .................................................. H01L 21/00
(52) U.S. Cl. .............................. 438/8; 156/345; 216/84; 216/88; 438/14; 438/692; 438/745
(58) Field of Search ...................... 438/641, 8, 692, 438/14, 693, 745, 756, 757; 216/38, 84, 88–89; 156/345 LC, 345 LP

(56) References Cited

U.S. PATENT DOCUMENTS

| | | |
|---|---|---|
| 4,430,151 | 2/1984 | Tsukada . |
| 4,471,220 | 9/1984 | Perry et al. . |
| 4,709,150 | 11/1987 | Burough et al. . |
| 5,002,391 | 3/1991 | Wolfrum et al. . |
| 5,045,149 | 9/1991 | Nulty . |
| 5,069,002 | * 12/1991 | Sandhu et al. .................... 216/84 X |
| 5,097,130 | 3/1992 | Koashi et al. . |
| 5,163,332 | 11/1992 | Wong . |
| 5,639,342 | 6/1997 | Chen et al. . |
| 5,647,952 | * 7/1997 | Chen ................................ 216/84 X |
| 5,726,067 | 3/1998 | Choi . |
| 5,739,051 | 4/1998 | Saito . |
| 5,748,297 | 5/1998 | Suk et al. . |

* cited by examiner

Primary Examiner—William A. Powell
(74) Attorney, Agent, or Firm—Jay H. Anderson

(57) ABSTRACT

In a chemical mechanical planarization assembly directed for the removal of oxide layers, which stop on films containing silicon nitride, a conventional polishing table is provided with a gas extraction unit which transmits a gas sample to an infrared spectrometer. The presence of ammonia in the slurry, which is generated when a stop layer containing silicon nitride is abraded under high pH conditions, can be detected using infrared spectroscopy and accordingly provides for an in situ endpoint detection method.

15 Claims, 3 Drawing Sheets

OPTIMIZATION OF CMP PROCESS BY DETECTING OF OXIDE/NITRIDE INTERFACE USING IR SYSTEM

This invention is related to the following co-pending U.S. patent applications:

Ser. No. 09/073,604 entitled "Indirect End Point Detection by Chemical Reaction and Chemiluminescence;"

Ser. No. 09/073,606 entitled "End Point Detection by Chemical Reaction and Photoionization;"

Ser. No. 09/129,003 entitled "Improved Chemical-Mechanical Polishing End Point Process Control;" and Ser. No. 09/129,102 entitled "Probe for Slurry Gas Sampling," each of which is incorporated herein by reference.

FIELD OF THE INVENTION

This invention relates to a chemical mechanical planarization ("CMP") process and, more particularly, improvements with the monitoring of the CMP process in connection with the removal of oxide films having stops on films containing silicon nitride.

BACKGROUND OF THE INVENTION

Fabrication techniques for the manufacture of the wafers for integrated circuits involve the formation of a series of layers upon a silicon wafer. In the typical manufacturing process, a wafer undergoes a photo resist step followed by photo lithography. Next, the wafer is etched, then stripped and then subjected to a diffusion step. The CMP process is then used to planarize the surface of the wafer before the wafer is subjected to repeated iterations of these steps which build multi layers on the wafer. CMP has been described as "wet sanding" the surface of the wafer to polish the surface of the wafer smooth, and the object of the planarization process is to achieve a highly uniform planar surface on the wafer.

The precise detection of the endpoints during the CMP process is a critical step in the processing of such multilayered integrated circuits. It is desirable to have each layer on the wafer extremely flat or planar before the creation of each successive layer because improving the surface both enhances the optical lithograph process and improves the metal interconnect reliability between layers. Before the incorporation of CMP processes, the topography of the wafer is irregular and, as a result, a lithographic image formed on the wafer may be out of focus. The lack of focus will interfere with the subsequent etching steps which may lead to problems with the interconnects between layers and may result in degraded chip performance and decreased yields. Further, since the deposition and etchback tolerances associated with large film are cumulative, any non-planarity of the resist is replicated in subsequent oxide surfaces.

The typical apparatus used in the CMP process includes a holder for the wafer which is held on a carrier. This assembly is rotated and pushed down on an abrasive pad mounted on a platen which rotates on a different axis and in an opposite direction from the carrier. A chemically active slurry containing small abrasive particles is introduced to the rotating pad which contributes both chemical and mechanical elements to the processes. When the CMP process is directed to an oxide layer on the wafer, the slurry contains fumed silica suspended in an aqueous solution containing KOH and having a pH of 10.5. The pH is maintained at high levels to keep the fumed silica particles suspended in the solution. When the slurry is intended for the polishing of a metallic layer, the slurry typically contains oxidizers and has a low pH (0.5 to 4). Typically, the particles in a slurry are chemically inert and are usually alumina, silica or both. New slurry is continuously introduced to the process as old slurry is removed. The old slurry will contain the abraded particles of both the pad and the wafer and end products of the chemical reaction. Following the CMP process, the wafer is buffed to remove any slurry and cleaned to provide a smooth final finish to the wafer.

The CMP process is used for the planarization of both dielectric and metallic layers. The CMP process, when applied to metallic layers' surfaces, involves a chemical reaction at the surface of the wafer which leaves the surface more susceptible to mechanical abrasion by the particles suspended in the slurry.

There are a wide number of variables which can influence the rate and uniformity of the planarization operation. Mechanical variables involved in the process include the rotational speeds of the platen and carrier, the back pressure applied to the pad, the profile of the pad and carrier, and the downward force applied to the platen. Further, the various components used in the process contribute to yet additional variables in the operation. Typically, the polishing pad on the platen is made of polyurethane and the surface is much rougher than the typical wafer being polished. Variation in the pads used for the removal or other consumables used in the process can significantly alter the rate of removal of layers on the wafer. In addition to the mechanical control parameters, the characteristics of the slurry add a number of additional variables, including the particle distribution, temperature, pH and its rate of introduction. Changes in the slurry temperature can stiffen the pad, thereby increasing removal rates and also affect the chemical dynamics. In addition to calculating the effects of the numerous variables identified above, the process itself is dynamic, further contributing to difficulties in precisely controlling the process to achieve repeatable results. In this regard, the CMP pad wears at an exponential rate when first put in use and then later wears in a linear fashion. As the CMP polishing pad ages, its removal of material from the wafer is not always uniform. Warpage of the wafer which can be caused by repeated thermal cycles in the fabrication process can also contribute to variations in the rate of removal of layers in the CMP process.

The total polishing time will depend on the initial film thickness and the film removal rate. The removal rate is dependant on the various process parameters identified above as well as variations in the depositing techniques which form the respective layers on the wafer. During the development of a new device, considerable time is expended selecting the optimal mechanical parameter for the CMP process, including the polishing pad features, the slurry characteristics, and the speeds and force between the platen and carrier. This process has relied heavily upon experimental data relating to uniformity and film removal rates.

In view of the configuration of the equipment, real time in situ determination of the CMP process endpoint presents difficulties. Merely attempting to precisely repeat operating conditions based upon historical results does not achieve reliable or satisfactory results. Removal of the wafer from the polishing table for periodic inspection and analysis significantly reduces the throughput and introduces further variables into the process, thereby altering the polishing rate.

In response to the need to monitor and control the progress of the CMP process, and more particularly, to accurately identify the endpoint of the process, a number of in situ techniques have been developed to monitor the rate of removal. For layers having metal components, a number of techniques have been directed at measuring the changes in the capacitance of the wafer. With particular respect to the measurement of dielectric layers where the foregoing technique is ineffective, efforts have included (1) attempting to measure changes in frictional forces between the pad and the wafer between layers, (2) providing a window through the polishing pad to allow for the measurement of changes in optical properties of the wafer between layers, and (3) sensing acoustical changes between the polishing pad and the various layers.

Efforts have also been addressed at reducing irregularities in the topography during the fabrication steps, including BPSG reflow, spin-on filming, resist etchback techniques, electroncyclotron resonant deposition (ECR), and high density plasma (HDP); however, these techniques have not been able to match CMP in the quality of planarity of the surface across the entire wafer. Techniques which involve baking the wafer at very high temperatures to allow the oxide material which has been deposited to liquify and reflow to increase the level degree of planarization, usually require the introduction of undesirable impurities to the oxide to lower the temperature so that the oxide will become vitrified. Moreover, repeated exposure ofthe device to very high temperatures can effect that performance of the device. When multiple levels of connection are desired in a device, non-CMP based methods of planarization alone are often inadequate. CMP provides a much more planar surface than available by employing alternative methods and can reduce or eliminate the need for doping in interlevel dielectric materials, thus eliminating the formation microcrystals.

Although each of these methods and detection techniques may contribute to improving planarization, there is nevertheless a continuing need for improved methods and devices for the in situ monitoring of the CMP process. Accurate and reliable control of the CMP process remains of critical importance in obtaining high yields in the manufacturing process.

SUMMARY OF THE INVENTION

The present invention is directed to extracting target constituents from an aqueous slurry used in the chemical polishing system and then using infrared spectrophotometric techniques to detect the presence of these targeted constituents. The rapid detection of target constituents which have been extracted into a gas phase allows an operator or automated controller to precisely identify interfaces between layers on multilayer wafers used in integrated circuits. Since the presence of a target constituent in a particular layer may occur at very low levels, the detector must exhibit a high degree of sensitivity. In the preferred embodiment, the target constituent is ammonia within the slurry which is continuously monitored. As a silicon nitride layer is polished using the CMP process, a very small amount of ammonia is created which can be extracted into a gas phase. The presence or absence of ammonia in the slurry provides an indication of the transition between a silicon oxide/silicon nitride interface on a wafer and, consequently, enables the identification of the endpoint of a polishing process. In the preferred embodiment, a laser diode absorption spectroscopy system which is optimized to detect characteristic absorption bands associated with ammonia gas is employed, thereby providing an indication of the removal of nitride film layer.

DETAILED DESCRIPTION

Figure 1:
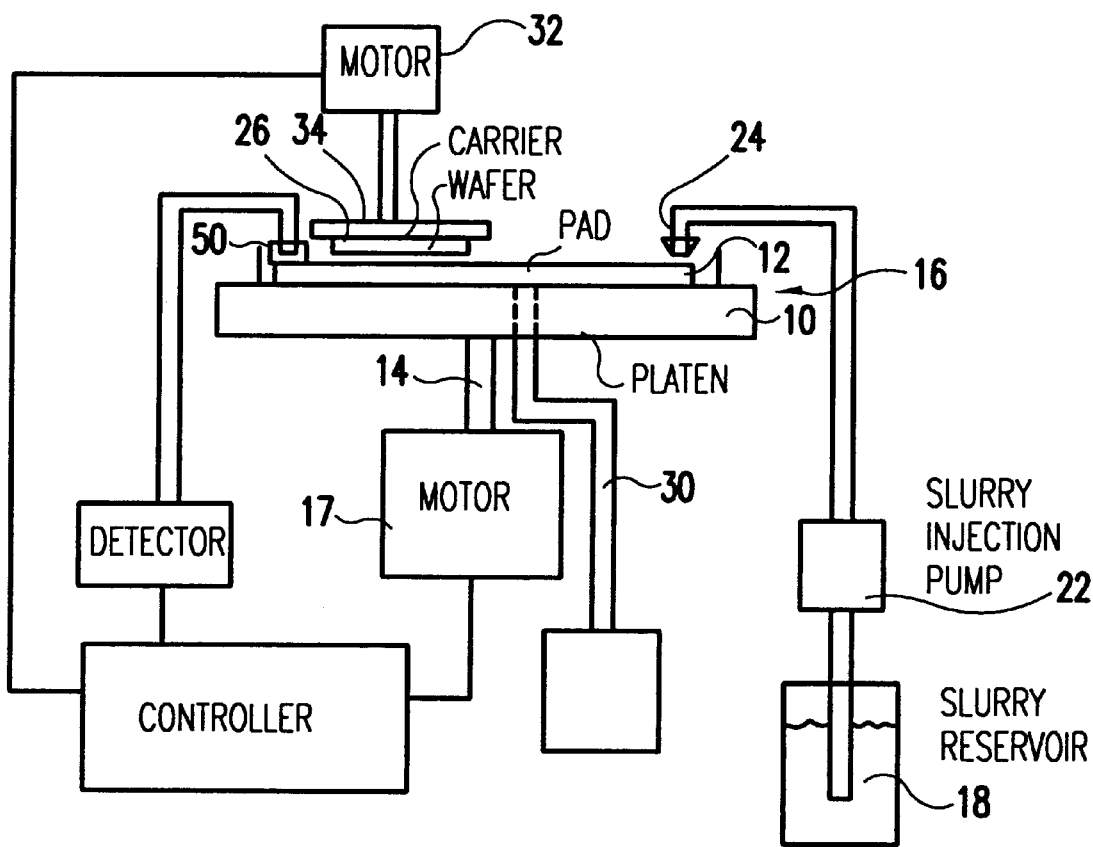
FIG. 1 is a schematic representation of a CMP device used in accordance with the present invention.

Now referring to FIG. 1, a chemical mechanical planarization CMP device is depicted which includes platen 10 which is turned by motor 17. On top of platen 10 is mounted polishing pad 12 which is typically formed of a synthetic resin such as polyurethane. Opposite and in engagement with polishing pad 12 is wafer 26 which is held in place by carrier 34. Carrier 34 is rotated by motor 32 and provides a downward force against polishing pad 12.

During the CMP operation, a slurry is continuously introduced to polishing pad 12 from slurry reservoir 18 through nozzle 24. In the preferred present embodiment, where a silicon dioxide layer containing silicon nitride endpoints is targeted for removal, the slurry selected is an aqueous solution having a pH between 10 and 11 and contains fumed silica. The silica particles suspended in the slurry are relatively inert and principally present to assist in the mechanical abrasion of the film surface.

Figure 3:
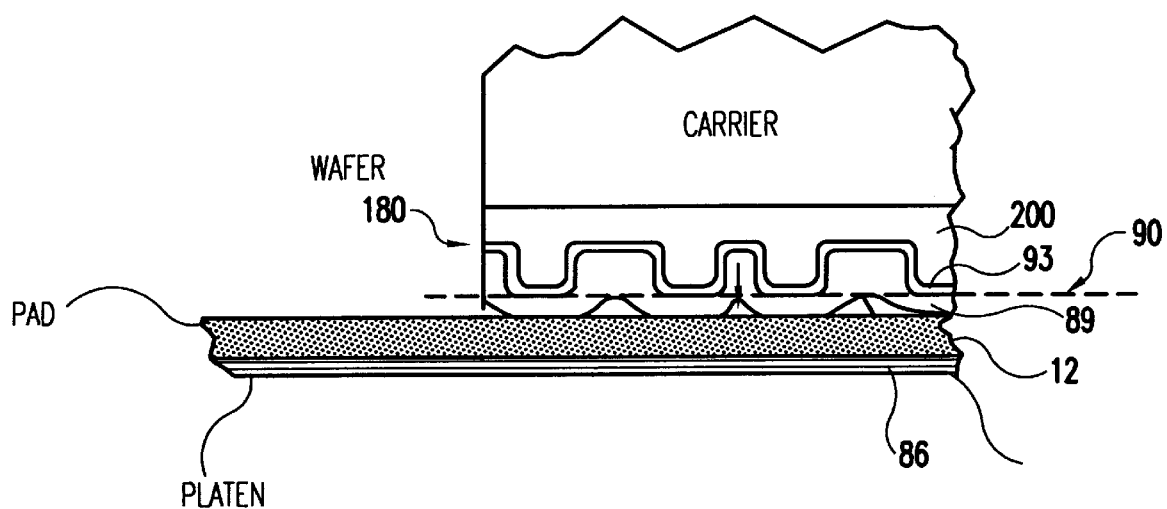
FIG. 3 is a side sectional view of a wafer containing a nitride layer in engagement with a polishing pad.

Now referring to FIG. 3, the surface of the wafer 180 subjected to the CMP process is comprised of a series of layers or films. A silicon nitride layer 93 is deposited on substrate 200. On top of the silicon nitride layer is deposited an oxide layer 89. Although the chemical activity of non-metallic surfaces deposited on wafers were generally considered to have minimal chemical activity because the constituents were considered substantially inert, it has been found that the removal of nitride layers creates small but appreciable amounts of ammonia. See co-pending U.S. application Ser. No. 09/073,606 entitled "End Point Detection by Chemical Reaction and Photoionization." When polishing silicon nitride, the following reaction occurs:

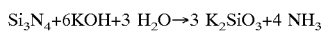

This ammonia can be readily extracted from the aqueous slurry when the slurry has a high pH. Liquid ammonia will undergo autoionization according to the following process:

However, in aqueous solutions containing a strong base, ammonia is evolved and the following reaction is driven to the right:

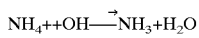

It is believed that the reaction formation of ammonia is enhanced in the CMP process, in part, because of the existence of a very large surface area exposed which is an inherent characteristic ofthe CMP process. The discovery of ammonia emission and its relationship to the process endpoint associated with the CMP processing of wafers has spurred the development of improved detection techniques.

Referring back to FIG. 3, wafer 180 is shown in engagement with polishing pad 12 and more particularly surface 86 of the oxide layer 89. When the polishing pad reaches the interface 90 between the oxide layer 89 and the silicon nitride layer 93, ammonia is created and introduced to the slurry.

During the polishing operation, a slurry injection pump 22 introduces an aqueous polishing slurry onto the rotating polishing pad 12 at a continuous and steady rate through nozzle 24. Downstream of the interface between the wafer surface and the polishing pad, an ammonia extraction unit 50 is immersed in the slurry. Extraction unit 50 is constructed from polypropylene micro porous hollow fibers and is hydrophobic. The fibers used in an extraction unit which can be used in a preferred embodiment of the invention are commercially available from Hoechst Celeanse. In an alternative embodiment, the extraction unit is constructed by application of a vacuum behind a micro porous hydrophobic pad made of a synthetic resin such as Gortex ®, or porous polyethylene, or Teflon®. Extraction units which can be used in connection with the present invention are further described in a co-pending U.S. application Ser. No. 09/129,102 entitled "Probe for Slurry Gas Sampling" and that application is expressly incorporated by reference herein.

In order to maintain the ammonia in the gas phase and to minimize the adherence of the gas molecules to the wall of the conduits, a dry and clean carrier gas is introduced downstream of the membrane. In view of the small sample size and the introduction of the carrier gas which further dilutes the sample, the concentration of ammonia available for testing from the polishing of the nitride layer is in the range between 1 to 100 ppb.

In view of the low concentration of the target gas available for detection, a highly sensitive detector and multipass flow cells must be employed to detect the presence of the gas constituents. Conventional detection techniques employed for the chemical detection in the gas phase such as mass spectrometry is not particularly effective in the present application. In this regard, although the use of a mass spectrometer can be highly sensitive and provide rapid results, the detection of ammonia gas presents unique problems in the instant circumstance because the atomic mass unit between water and ammonia only differs by a single unit. Further, it is typical in conventional mass spectrometer results to experience some fragmentation of the water molecules which causes it to ionize and loose a hydrogen atom, producing a species having an identical mass to ammonia. The combination of the identical mass at 17 and the large abundance of hydroxy ion fragments in the sample can completely mask the ammonia signal and make the direct detection of ammonia by conventional mass spectrometry techniques impossible.

IR spectroscopy is the measurement of the wavelength and intensity of the absorption of midinfrared light by a sample. The wavelength of IR absorption bands are characteristic of specific types of chemical bonds, and although IR spectroscopy finds its greatest utility for identification of organic and organo-metallic molecules, it can be employed to detect N-H bonds. Mid-infrared light (2.5–50 $\mu$m, 4000–200 cm$^{-1}$) is energetic enough to excite molecular vibrations to higher energy levels. When atoms or molecules absorb light, the incoming energy excites a quantized structure to a higher energy level and the type of excitation depends on the wavelength of the light. Electrons are promoted to higher orbitals by ultraviolet or visible light, vibrations are excited by infrared light, and rotations are excited by microwaves. An absorption spectrum is the absorption of light as a function of wavelength. The spectrum of an atom or molecule depends on its energy level structure, and absorption spectra are useful for the identification of compounds. Although conventional infrared techniques are well known and reliable, the sensitivity of such methods is poor.

In accordance with the present invention, the detector selected employs infrared spectroscopy, and more particularly laser diode absorption techniques. In the IR band $NH_3$ has typical absorption peaks at 1.97$\mu$, 2.3$\mu$, 3$\mu$ and further in the 6–7$\mu$ band. Recently, laser-based infrared absorption techniques have been developed which have sensitivities better than 1 ppm using a 1 meter path length in the 3$\mu$ region. Nevertheless, commercially available lasers and detectors in this region are unreliable primarily due to the low temperature required for operation (liquid nitrogen temperature or lower). An alterative approach has been in the 1.5 micron region where molecular overtone and combination bands associated with $NH_3$ appear. These bands are inherently weaker, but this is compensated by the superior diode lasers and detectors available in this region. In this regard, the availability of narrow band single mode lasers, which can overlap specific rovibrational molecular transitions, enables such detection. Frequency locking techniques allow a particular transition to be monitored for extended periods without drift of the laser frequency. Additionally, there are sophisticated detection techniques available, in particular, frequency modulation with second derivative lock-in detection. The diode lasers' frequency can be rapidly swept and the signal detected in phase with the modulation. This technique greatly reduces noise and has enabled detection sensitivities of better than 1 ppm using a 1 meter path length with a response time of 2 seconds. Commercial systems which may be adapted to this application are presently sold by Altopric Ab Box 8910, 402 73 Goteburg, Sweden. Instruments employing tunable diode lasers for infrared absorption measurement of trace gases, including $NH_3$, are also available from Aerodyne Research, Inc., 45 Manning Road, Billerica, Mass. 01821-3976 which have wide spectral coverage (3 to 15 m with extreme sensitivity 0.1 to 1.0 ppb detectivity).

Figure 2:
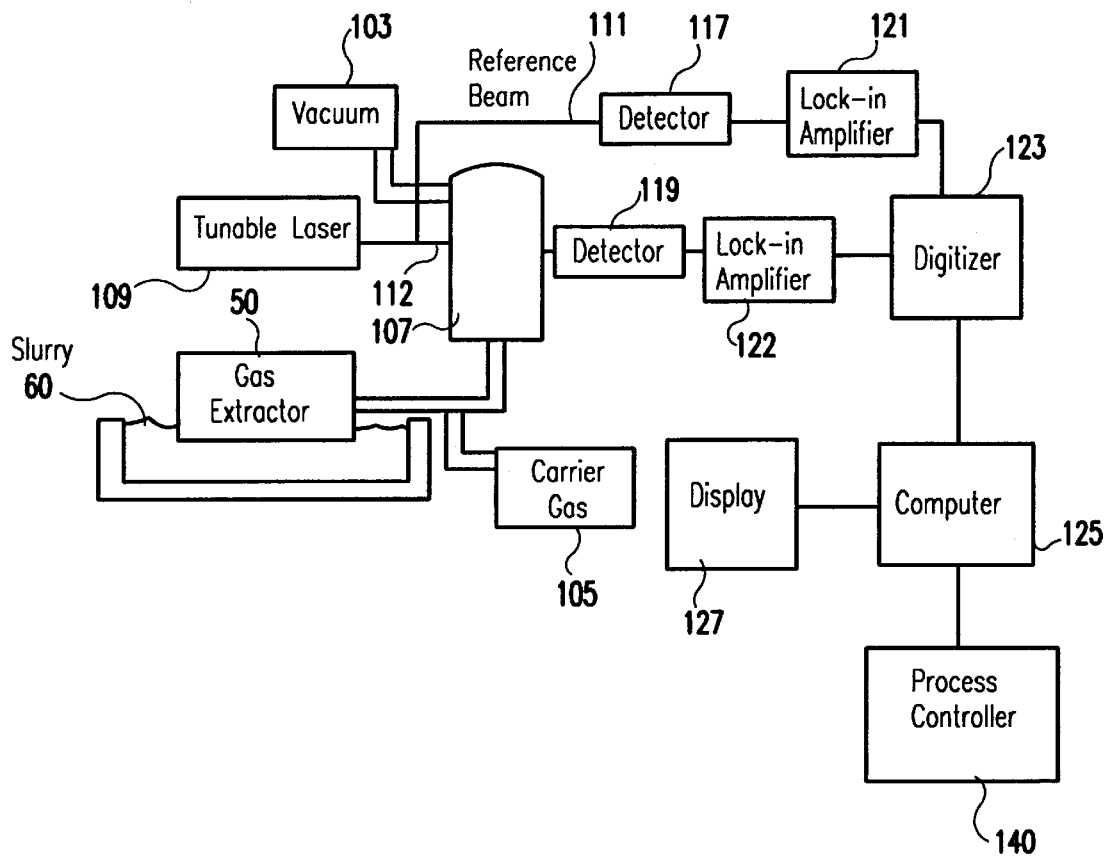
FIG. 2 is a schematic representation of the detection device in accordance with the present invention.

Referring now to FIG. 2, the gas sample is extracted from the slurry by drawing a vacuum 103 through the extraction unit 50 which has been immersed into the polishing slurry 60. The ammonia gas extracted is then combined with a dry carrier gas 105 and drawn into the flow cell 107. Infrared radiation from a tunable laser diode 109 is split to provide a reference beam and a measurement beam 112. Detectors 117 and 119 measure the intensity of the light and then amplify the signal in equal increments and transmit the signal to the digitizer 123. The signal from the reference beam and the measurement beam is processed to result in an absorption measurement. The measurement can be displayed, recorded and/or directed to the process controller 104 to automatically end the CMP process.

Although a specific embodiment has been described and illustrated herein, those having skill in the art will appreciate that there are additional arrangements and applications employing the invention which may be substituted for the specific disclosure as described herein. Having thus described the present invention and its preferred embodiment in detail, it will be readily apparent to those skilled in the art that further modifications to the invention may be made without departing from the spirit and scope of the invention as presently claimed.

What is claimed is:

1. A method for detecting the removal of a target layer which has been deposited on a stop layer in a chemical mechanical planarization process comprising introducing a slurry to a polishing table comprising a polishing pad, engaging the surface of a wafer with said polishing pad and said slurry creating a reactant resulting from a chemical reaction between said slurry and said stop layer, extracting said reactant from said slurry and putting said reactant into a gas phase, and detecting the presence of said reactant gas using infrared spectroscopy.

2. The method recited in claim 1 wherein said infrared spectroscopy detection step further comprises use of a laser diode which emits radiation in the spectral region between 1.5 microns and 3 microns.

3. The method recited in claim 2 wherein said laser diode is tunable.

4. The method recited in claim 1 wherein said stop layer comprises silicon nitride and said reactant comprises ammonia.

5. The method recited in claim 1 wherein said slurry comprises KOH.

6. The method recited in claim 1 further comprising generating a signal from said detector, said signal reflecting the presence or absence of said reactant gas.

7. The method recited in claim 6 further comprising transmitting said signal to a CMP controller to control CMP process variables.

8. A method for monitoring the removal of an oxide film deposited on top of a stop layer, said stop layer comprising silicon nitride in a chemical mechanical planarization process of a wafer comprising the steps of continuously introducing slurry to a polishing table having a pH greater than 7, allowing said slurry and a polishing pad to abrade said wafer wherein said stop layer is exposed to said polishing pad and abraded thereby introducing said silicon nitride into said slurry, allowing said slurry and said silicon nitride from said stop layer to react to form ammonia, continuously extracting sample gas from said slurry, said sample gas containing said ammonia, introducing said sample gas to a spectrometer, said spectrometer comprising a radiant energy source, and a detector, said energy source emitting radiation in the spectra between 1.5 and 3 microns.

9. A chemical mechanical planarization assembly for planarization of a wafer comprising a target layer comprising silicon oxide having a stop layer comprising silicon nitride, said assembly comprising:

a platen on which is mounted a polishing pad, said platen and said polishing pad forming a polishing table, a carrier adapted to receive said wafer opposite said polishing pad, a slurry injector for introducing slurry to said polishing table at a first location, at least one motor to provide for movement between said polishing pad and said wafer, an extraction unit for acquiring a gaseous sample from said slurry at a second location on said polishing table, a conduit to transfer said gaseous sample from said extraction unit to a detector, said detector further comprising a spectrometer adapted for absorption measurements in the infrared spectrum.

10. The chemical mechanical planarization assembly as recited in claim 9 wherein said spectrometer further comprises a laser diode.

11. The chemical mechanical planarization assembly as recited in claim 9 wherein said laser diode is tunable to a plurality of wavelengths within the infrared spectrum.

12. The chemical mechanical planarization assembly as recited in claim 9 wherein said detector generates a signal in response to the presence of a target gas in said gaseous sample.

13. The chemical mechanical planarization assembly as recited in claim 12 further comprising a processor and a controller, wherein said processor interprets said signal from said detector and transmits control signals to said controller and said controller controls processing variables in a chemical mechanical planarization process in response to said control signals received from said processor.

14. The chemical mechanical planarization assembly as recited in claim 13 wherein said process variables comprise the speed of rotation of the platen and carrier, the force between the wafer and the pad, the temperature of the slurry, and the rate of introduction of slurry.

15. The chemical mechanical polishing device recited in claim 13, wherein said processor determines an endpoint of said chemical mechanical planarization process and said controller stops the processing of said wafer in response to said signal.

* * * * *